United States Patent
Kominato et al.

(10) Patent No.: US 8,043,771 B2
(45) Date of Patent: Oct. 25, 2011

(54) PHASE SHIFT MASK BLANK AND METHOD OF MANUFACTURING PHASE SHIFT MASK

(75) Inventors: Atsushi Kominato, Shinjuku-ku (JP);
Toshiyuki Suzuki, Shinjuku-ku (JP);
Yasushi Okubo, Shinjuku-ku (JP)

(73) Assignee: Hoya Corporation, Tokyo (JP)

( * ) Notice: Subject to any disclaimer, the term of this patent is extended or adjusted under 35 U.S.C. 154(b) by 107 days.

(21) Appl. No.: 12/416,468

(22) Filed: Apr. 1, 2009

(65) Prior Publication Data
US 2009/0253054 A1 Oct. 8, 2009

(30) Foreign Application Priority Data

Apr. 2, 2008 (JP) ................................. 2008-095924
Feb. 17, 2009 (JP) ................................. 2009-034480

(51) Int. Cl.
*G03F 1/00* (2006.01)
(52) U.S. Cl. ......................................................... 430/5
(58) Field of Classification Search .............. 430/5, 322, 430/323, 394; 428/428, 430
See application file for complete search history.

(56) References Cited

U.S. PATENT DOCUMENTS

| 5,851,702 | A | 12/1998 | Watanabe et al. | |
| 6,924,070 | B2 * | 8/2005 | Hwang | 430/5 |
| 7,011,910 | B2 | 3/2006 | Shiota et al. | |
| 7,314,690 | B2 * | 1/2008 | Okubo et al. | 430/5 |

FOREIGN PATENT DOCUMENTS

| JP | 10-069055 A | 3/1998 |
| JP | 2003-322947 A | 11/2003 |
| WO | 2004/090635 A1 | 10/2004 |

* cited by examiner

*Primary Examiner* — Stephen Rosasco
(74) *Attorney, Agent, or Firm* — Sughrue Mion, PLLC (57) ABSTRACT

Disclosed is a phase shift mask blank (11) that can prevent the occurrence of a loading effect. The phase shift mask blank (11) includes a phase shift film (5) containing silicon, a light-shielding film (2) made of a material resistant to etching of the phase shift film (5), and an etching mask film (3) made of an inorganic material resistant to etching of the light-shielding film (2), which are formed in this order on a substrate (1) transparent to exposure light. Assuming that the thickness of the phase shift film (5) is $t_1$, the etching rate of the phase shift film (5) by dry etching with an etchant using the etching mask film (3) and the light-shielding film (2) as a mask is $v_1$, the thickness of the etching mask film (3) is $t_2$, and the etching rate of the etching mask film (3) by dry etching with the above etchant is $v_2$, $(t_1/v_1) \leqq (t_2/v_2)$ is satisfied.

16 Claims, 3 Drawing Sheets

PHASE SHIFT MASK BLANK AND METHOD OF MANUFACTURING PHASE SHIFT MASK

This application is based upon and claims the benefit of priority from Japanese Patent Application No. 2008-095924, filed on Apr. 2, 2008, and Japanese Patent Application No. 2009-034480, filed on Feb. 17, 2009, the disclosures of which are incorporated herein in their entirety by reference.

TECHNICAL FIELD

This invention relates to a phase shift mask blank and a method of manufacturing, from the phase shift mask blank, a phase shift mask for use in the manufacture of semiconductor devices, display devices (display panels), or the like.

BACKGROUND ART

The miniaturization of semiconductor devices and the like is advantageous in bringing about an improvement in performance and function (higher-speed operation, lower power consumption, etc.) and a reduction in cost and thus has been accelerated more and more. The lithography technique has been supporting this miniaturization and transfer masks are a key technique along with exposure apparatuses and resist materials.

In recent years, use has been made of photomasks applied with the resolution enhancement technology (RET) such as the phase shift technique. A phase shift mask is a photomask that can improve the resolution of a transfer pattern using interference of light caused by a phase shifter.

Normally, inasmuch as the photolithography is performed by reduced projection exposure in microprocessing of a semiconductor substrate, a pattern of a transfer mask has a size about four times that of a pattern to be formed on the semiconductor substrate. However, in the photolithography according to the semiconductor design rule of DRAM half-pitch (hp) 45 nm and onward, the size of a circuit pattern on a mask is smaller than a wavelength of exposure light. Therefore, if reduced projection exposure of a circuit pattern is carried out using a transfer mask formed with a transfer pattern according to the design, the shape of the transfer pattern cannot be exactly transferred onto a resist film on a semiconductor substrate due to the influence of exposure light interference or the like.

Under these circumstances, as a mask employing the resolution enhancement technology, use is made of an OPC mask or the like applied with a technique of correcting an optical proximity effect, which degrades the transfer characteristics, by performing optical proximity effect correction (OPC) (see, e.g. JP-A-H10-69055 and corresponding U.S. Pat. No. 5,851,702). For example, it is necessary to form on the OPC mask an OPC pattern (e.g. an assist bar or a hammer head having a line width less than 100 nm) having a size half or less of that of the circuit pattern.

DISCLOSURE OF THE INVENTION

For forming a fine pattern according to the semiconductor design rule of DRAM half-pitch (hp) 45 nm and onward, it is necessary to use high-NA (hyper-NA) exposure with a numerical aperture NA>1, for example, immersion exposure.

The immersion exposure is an exposure method that can improve the resolution by filling a liquid between a wafer and a lowermost lens of an exposure apparatus so that the numerical aperture is increased by the refractive index of the liquid times as compared with that in the case of air whose refractive index is 1. The numerical aperture is given by NA=n×sin θ, where θ represents an angle formed between a light ray incident on the lowermost lens of the exposure apparatus at its outermost portion and the optical axis and n represents a refractive index of a medium between the wafer and the lowermost lens of the exposure apparatus.

However, it has been found that there is a problem in that the expected CD accuracy cannot be obtained by employing the immersion exposure with NA>1 to form a fine pattern according to the semiconductor design rule of DRAM half-pitch (hp) 45 nm (hereinafter referred to as "hp45 nm") and onward.

As one of its causes, there is considered to be an influence of a loading effect described below.

Specifically, in the hp45 nm mask fabrication, as pattern miniaturization advances, patterns of various sizes are used and differences in size of the patterns increase. There is a case where a thin pattern (e.g. the above-mentioned OPC pattern) is arranged near a wide pattern and, in this case, the difference in pattern area occurs locally. Also in the mask plane, the difference in pattern density increases due to the pattern miniaturization. This pattern density difference causes a loading effect when forming a mask pattern by dry etching. Herein, "loading effect" refers to a phenomenon in which the etching rate changes due to a difference in etching pattern area. Generally, when the area of an etching pattern is large (i.e. at a portion where the etching pattern is dense and thus the etching area is large), the etching rate becomes slow. Conversely, when the area of an etching pattern is small (i.e. at a portion where the etching pattern is sparse and thus the etching area is small), the etching rate becomes fast. Thus, the difference in etching rate occurs in the mask plane due to the loading effect, thereby causing a reduction in pattern size accuracy in the mask plane. In the hp45 nm mask fabrication, inasmuch as the difference in pattern density increases following the pattern miniaturization, the influence of the loading effect also increases to make high-accuracy mask fabrication more difficult.

Also in an etching mask film (inorganic etching mask film) for use in assisting the hp45 nm mask fabrication, the loading effect is expected to occur and thus to reduce the fabrication accuracy. Therefore, in order to carry out higher-accuracy mask fabrication, it is necessary to reduce the loading effect to thereby enhance the processing accuracy of pattern formation.

Specifically, in a mask fabrication process using a phase shift mask blank coated with an etching mask film, the patterned etching mask film is used as a mask to process a Cr film under highly anisotropic Cr etching conditions and then to process a halftone film (see, e.g. International Publication No. WO2004/090635 and corresponding U.S. Pat. No. 7,314,690).

Herein, when etching the halftone film made of MoSiN, the etching mask film made of MoSiN is also etched. Further, inasmuch as the etching mask film is thinner than the halftone film (e.g. in the current hp45 nm mask fabrication, it is preferable that the thickness of the halftone film be set to 70 nm and the thickness of the etching mask film be set to 5 to 40 nm in terms of mask fabrication), the etching of the etching mask film is finished before that of the halftone film is finished.

Figure 2A:
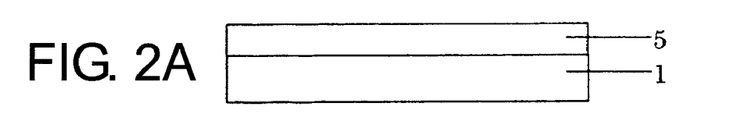
FIGS. 2A to 2I are exemplary diagrams for explaining phase shift mask blank manufacturing processes and phase shift mask manufacturing processes according to this invention.
Figure 2B:
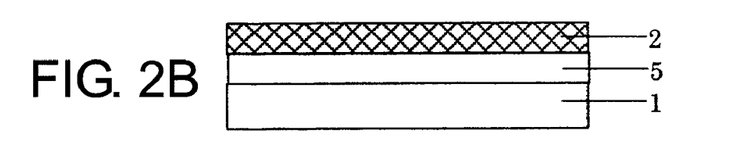
Figure 2C:
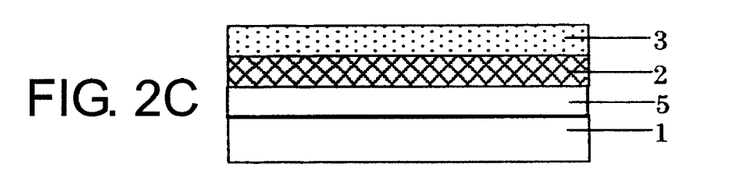
Figure 2D:
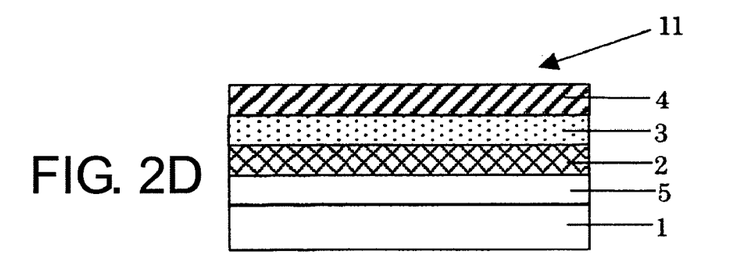
Figure 2E:
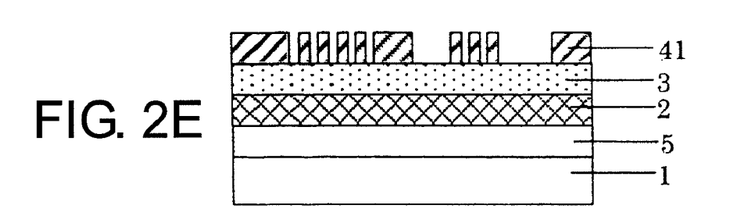
Figure 2F:
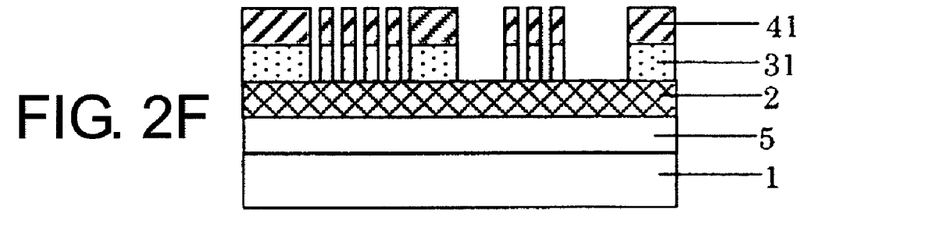
Figure 2G:
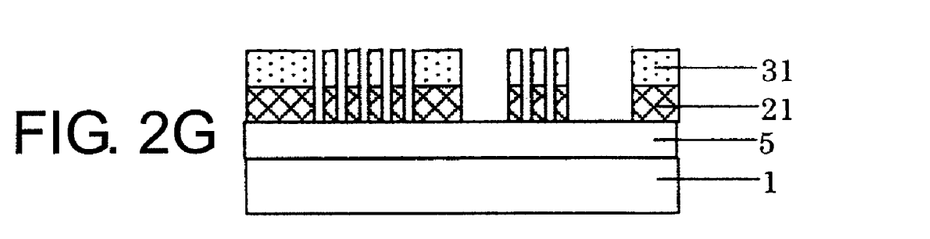

In this event, before the etching mask film disappears, the MoSiN film is exposed (present) over the entire mask surface when seen from above and thus the loading effect does not occur (see FIG. 2G). Then, when the etching mask film is etched to disappear (i.e. a Cr pattern is exposed as a result), there occurs a difference in area of the halftone film being etched, thus causing the loading effect that reduces the pattern size accuracy.

Therefore, in the mask fabrication of the hp45 nm and onward where high-accuracy mask fabrication is required, the subject is to reduce the loading effect to further improve the pattern processing accuracy.

This invention has been made in view of the above-mentioned problems and has an object to provide a phase shift mask blank and so on that can prevent the occurrence of a loading effect.

It is another object of this invention to provide a phase shift mask blank and so on that can reduce the influence of the loading effect that occurs when performing mask fabrication using the phase shift mask blank coated with an etching mask film, thereby enabling formation, with high processing accuracy, of a fine pattern seen in a mask in the generation of the semiconductor design rule of DRAM half-pitch (hp) 45 nm and onward.

This invention has the following configurations.

(Configuration 1)

A phase shift mask blank comprises a substrate transparent to exposure light, a phase shift film containing silicon, a light-shielding film made of a material resistant to etching of the phase shift film, and an etching mask film made of an inorganic material resistant to etching of the light-shielding film. The phase shift film, the light-shielding film, and the etching mask film are formed in this order on the substrate. The phase shift mask blank is characterized by $$(t_1/v_1) \leq (t_2/v_2)$$

where $t_1$ is a thickness of the phase shift film, $v_1$ is an etching rate of the phase shift film by dry etching with an etchant using the etching mask film and the light-shielding film as a mask, $t_2$ is a thickness of the etching mask film, and $v_2$ is an etching rate of the etching mask film by dry etching with the etchant.

According to the invention of Configuration 1, for example, when etching the phase shift film using the etching mask film and the light-shielding film as an etching mask, inasmuch as the etching mask film and the phase shift film have substantially the same etching selectivity (e.g. the etching selectivity between the phase shift film and the etching mask film with respect to an etching gas for the phase shift film is 0.9 to 1.1, i.e. close to 1), both films are etched, but, it is possible to prevent the occurrence of a loading effect in the etching of the phase shift film by satisfying a relational expression of $(t_1/v_1) \leq (t_2/v_2)$ where $t_1$ is the thickness of the phase shift film, $v_1$ is the etching rate of the phase shift film, $t_2$ is the thickness of the etching mask film, and $v_2$ is the etching rate of the etching mask film.

Further, inasmuch as the etching rate $v_2$ of the etching mask film is lower than the etching rate $v_1$ of the phase shift film, the thickness of the etching mask film can be set thin (e.g. half or less of the thickness of the phase shift film) when etching the phase shift film using the etching mask film and the light-shielding film as an etching mask. As a result, it becomes possible to improve the processing accuracy of a pattern of the phase shift film.

In this invention, as described above, even if the thickness of the etching mask film is set thin (e.g. half or less of the thickness of the phase shift film), it is possible to prevent the occurrence of the loading effect in the etching of the phase shift film by satisfying the relational expression of $(t_1/v_1) \leq (t_2/v_2)$ where $t_1$ is the thickness of the phase shift film, $v_1$ is the etching rate of the phase shift film, $t_2$ is the thickness of the etching mask film, and $v_2$ is the etching rate of the etching mask film.

In this specification, "A/B" represents that A is a numerator and B is a denominator.

(Configuration 2)

The etching rate $v_2$ of the etching mask film to the etching rate $v_1$ of the phase shift film is $0.07v_1$ to $0.5v_1$.

With this configuration, inasmuch as the etching rate $v_2$ of the etching mask film is $0.07v_1$ to $0.5v_1$, i.e. lower than the etching rate $v_1$ of the phase shift film, the thickness of the etching mask film can be set thin when etching the phase shift film using the etching mask film and the light-shielding film as an etching mask. As a result, it becomes possible to improve the processing accuracy of a pattern of the phase shift film.

(Configuration 3)

The light-shielding film is made of a material containing chromium and the etching mask film is a silicon-containing film containing silicon. With this configuration, the etching mask film and the light-shielding film can be formed to have mutually different etching selectivities. Further, the etching mask film can be formed to have substantially the same etching selectivity as that of the phase shift film containing a metal and silicon.

(Configuration 4)

A phase shift mask manufacturing method comprises the steps of:

forming a resist pattern on the etching mask film of the phase shift mask blank according to any one of configurations 1 to 3 and dry-etching the etching mask film with a first etchant using the resist pattern as a mask, thereby forming an etching mask film pattern;

dry-etching the light-shielding film with a second etchant using the etching mask film pattern or the resist pattern and the etching mask film pattern as a mask, thereby forming a light-shielding film pattern; and dry-etching the phase shift film with a third etchant using the etching mask film pattern and the light-shielding film pattern as a mask, thereby forming a phase shift film pattern.

With this configuration, it is possible to obtain an effect similar to that of Configuration 1.

(Configuration 5)

The etching mask film remains after forming the phase shift film pattern and the phase shift mask manufacturing method further comprises a step of removing the etching mask film. With this configuration, inasmuch as the etching mask film remains after forming the phase shift film pattern, it is possible to reliably prevent the occurrence of a loading effect in the etching of the phase shift film.

(Configuration 6)

The first etchant and the third etchant are each an etchant containing a fluorine-based gas and the second etchant is an etchant containing a chlorine-based gas. With this configuration, it is possible to obtain an effect similar to that of Configuration 3.

According to this invention, it is possible to provide a phase shift mask blank and so on that can prevent the occurrence of a loading effect.

Further, according to this invention, it is possible to provide a phase shift mask blank and so on that can reduce the influence of a loading effect that occurs when performing mask fabrication using the phase shift mask blank coated with an etching mask film, thereby enabling formation, with high processing accuracy, of a fine pattern seen in a mask in the generation of the hp45 nm and onward.

BEST MODE FOR CARRYING OUT THE INVENTION

Hereinbelow, an embodiment according to this invention will be described with reference to the drawings.

Figure 1:
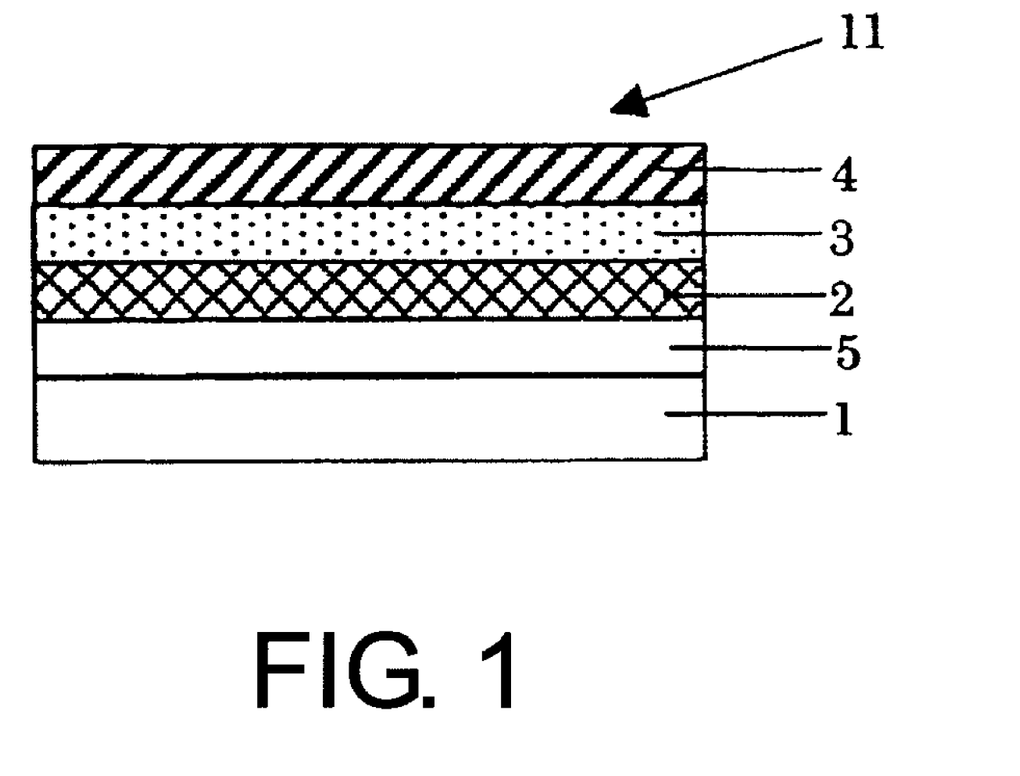
FIG. 1 is an exemplary diagram showing one example of a phase shift mask blank according to this invention.

FIG. 1 is a sectional view showing one example of a phase shift mask blank 11 according to the embodiment of this invention. In this example, the phase shift mask blank 11 comprises a transparent substrate 1, a phase shift film 5, a light-shielding film 2, an etching mask film 3, and a resist film 4 formed in this order.

As the phase shift film 5, use can be made of, for example, a silicon-containing film containing silicon. As the silicon-containing film, there can be cited a silicon film, a metal silicide film containing silicon and a metal such as chromium, tantalum, molybdenum, titanium, hafnium, or tungsten, or a film containing at least one of oxygen, nitrogen, and carbon in the silicon film or the metal silicide film. Specifically, as the phase shift film 5, use can be made of, for example, a film mainly containing a transition metal silicide oxide, a transition metal silicide nitride, a transition metal silicide oxynitride, a transition metal silicide oxycarbide, a transition metal silicide nitride carbide, or a transition metal silicide oxynitride carbide. More specifically, as the phase shift film 5, use can be made of, for example, a molybdenum-based (MoSiON, MoSiN, MoSiO, or the like) halftone film, a tungsten-based (WSiON, WSiN, WSiO, or the like) halftone film, a silicon-based (SiN, SiON, or the like) halftone film, or the like.

Still more specifically, as the phase shift film 5, use can be made of, for example, a halftone film composed of two layers, i.e. a phase adjusting layer for mainly controlling the phase of exposure light and a transmittance adjusting layer for mainly controlling the transmittance of exposure light (see, e.g. Japanese Unexamined Patent Application Publication (JP-A) No. 2003-322947 and corresponding U.S. Pat. No. 7,011,910). Herein, as a material of the transmittance adjusting layer, use can be made of a material containing one kind or two or more kinds selected from metals and silicon, or an oxide, nitride, oxynitride, carbide, or the like thereof. Specifically, there can be cited a material containing one kind or two or more kinds selected from aluminum, titanium, vanadium, chromium, zirconium, niobium, molybdenum, lanthanum, tantalum, tungsten, silicon, and hafnium, or an oxide, nitride, oxynitride, carbide, or the like thereof. As the phase adjusting layer, it is preferable to use a silicon-based thin film made of silicon oxide, silicon nitride, silicon oxynitride, or the like because relatively high transmittance can be easily obtained for exposure light in the ultraviolet region.

As the etching mask film 3, use can be made of, for example, a silicon-containing film containing silicon. As the silicon-containing film, there can be cited a silicon film, a metal silicide film containing silicon and a metal such as chromium, tantalum, molybdenum, titanium, hafnium, or tungsten, or a film containing at least one of oxygen, nitrogen, and carbon in the silicon film or the metal silicide film. Specifically, as the etching mask film 3, use can be made of, for example, a film mainly containing a transition metal silicide oxide, a transition metal silicide nitride, a transition metal silicide oxynitride, a transition metal silicide oxycarbide, a transition metal silicide nitride carbide, or a transition metal silicide oxynitride carbide. More specifically, as the etching mask film 3, use can be made of, for example, a molybdenum-based (MoSiON, MoSiN, MoSiO, MoSiCO, MoSiCN, MoSiCON, or the like) film, a tungsten-based (WSiON, WSiN, WSiO, or the like) film, a silicon-based (SiN, SiON, or the like) film, or the like. For example, when the phase shift film 5 is made of MoSiN, the etching mask film 3 is preferably made of MoSiN, MoSiON, or SiON.

The light-shielding film 2 can be made of a material resistant to etching of the phase shift film 5. For example, as the light-shielding film 2, use can be made of a metal film containing a metal. As the metal film containing the metal, there can be cited a film made of chromium, tantalum, molybdenum, titanium, hafnium, tungsten, any of alloys containing those elements, or any of materials containing those elements or those alloys (e.g. a film containing at least one of oxygen, nitrogen, silicon, and carbon in addition to any of the materials containing those elements or those alloys).

Specifically, as the light-shielding film 2, use can be made of, for example, a material comprising chromium alone or a material containing chromium and at least one element selected from oxygen, nitrogen, carbon, and hydrogen (Cr-containing material). The light-shielding film 2 may have a film structure composed of a single layer or a plurality of layers made of the above-mentioned film material. With different compositions, the light-shielding film 2 may have a film structure in which a plurality of layers are formed stepwise or a film structure in which the composition continuously changes.

The specific light-shielding film 2 is a laminated film composed of a light-shielding layer in the form of a chromium nitride film (CrN film) and a chromium carbide film (CrC film) and an antireflection layer in the form of a film containing chromium, oxygen, and nitrogen (CrON film). The chromium nitride film is a layer mainly containing chromium nitride (CrN) and has a thickness of, for example, 10 nm to 20 nm. The chromium carbide film is a layer mainly containing chromium carbide (CrC) and has a thickness of, for example, 25 nm to 60 nm. The film containing chromium, oxygen, and nitrogen (CrON film) has a thickness of, for example, 15 nm to 30 nm.

In this invention, in order to solve the foregoing problem, there is employed a method of designing the etching mask film so that the etching time of the etching mask film (the time required until the film disappears; the same shall apply hereinafter) becomes equal to or longer than that of the halftone film, thereby reducing a loading effect in etching of the halftone film using the etching mask film and the light-shielding film as a mask. Specifically, assuming that the thickness of the halftone film acting as the phase shift film is $t_1$, the etching rate of the phase shift film by dry etching with an etchant using the etching mask film and the light-shielding film as a mask is $v_1$, the thickness of the etching mask film is $t_2$, and the etching rate of the etching mask film by dry etching with the etchant is $v_2$, it is designed to satisfy $(t_1/v_1) \leq (t_2/v_2)$. Inasmuch as a process of removing the etching mask film is additionally required if the etching mask film remains after the etching of the halftone film, the design is preferably made to satisfy $(t_1/v_1) = (t_2/v_2)$. It may alternatively be designed that the etching mask film remains with a thickness that enables removal thereof by physical etching using an etching gas during etching of the light-shielding film after the etching of the halftone film.

The etching time of the etching mask film can be controlled by the composition and thickness of the etching mask film. The etching time of the etching mask film is defined as (etching mask film thickness $t_1$)/(etching mask film etching rate $v_1$).

Herein, in a phase shift mask blank for use in the generation of the semiconductor design rule of DRAM half-pitch (hp) 45 nm and onward, the thickness of an etching mask film is preferably 5 nm to 40 nm in terms of mask fabrication, while, the thickness of a halftone film is preferably 100 nm or less (e.g. 70 nm) provided that it produces a required phase difference (e.g. 175 degrees to 185 degrees). Taking the above into account, in the phase shift mask blank for use in the generation of the semiconductor design rule of DRAM half-pitch (hp) 45 nm and onward, the etching rate required for the etching mask film is preferably 0.07 times to 0.5 times lower than that of the halftone film.

As one of methods of controlling the etching rate of the etching mask film, there can be cited a method of controlling the composition of the etching mask film.

The etching mask film can be made of a material selected from MoSiN, MoSiON, and SiON, while the halftone film can be made of a material selected from MoSiN and MoSiON. In this event, when the etching mask film is made of MoSiN and the halftone film is also made of MoSiN, inasmuch as both films are made of the same material, the etching rate of the MoSiN film depends on the content ratio between Mo and Si rather than the N content. The etching rate of the etching mask film can be set lower than that of the halftone film by increasing the Mo content in the etching mask film.

For example, by setting the Mo—Si content ratio of the etching mask film to (Mo:Si=4:5 to 9:1) with respect to the Mo—Si content ratio (Mo:Si=1:9) of the halftone film and setting the thickness of the etching mask film to 40 nm (Mo:Si=4:5; the etching rate ratio to the etching rate of the halftone film is about 0.5 times) to 5 nm (Mo:Si=9:1; the etching rate ratio to the etching rate of the halftone film is about 0.07 times), it is possible to make the etching time of the etching mask film coincide with that of the halftone film. By controlling the composition and thickness of the etching mask film based on these conditions, it is possible to make the etching time of the etching mask film longer than that of the halftone film within the thickness range of 5 to 40 nm or a range close to it required for the etching mask film in the phase shift mask blank for use in the generation of the semiconductor design rule of DRAM half-pitch (hp) 45 nm and onward. For adaptation to a finer pattern, the thickness of the etching mask film is preferably set to 20 nm or less and, in this event, the upper limit of the etching rate ratio of the etching mask film to the etching rate of the halftone film may be set to about 0.25 times.

On the other hand, the etching rate of the etching mask film made of SiON can also be controlled by the composition ratio thereof. The etching rate of SiON can be lowered by reducing the N content and increasing the O content. By setting the Si—O—N content ratio of the etching mask film to (Si:O:N=35:45:20) with respect to the Mo—Si content ratio (Mo:Si=1:9) of the halftone film, it is possible to make the etching time of the etching mask film coincide with that of the halftone film.

The composition ratio and thickness of the halftone film are determined by giving priority to the optical properties (phase shift amount and transmittance for exposure light to be used) of the halftone film.

In this invention, phase shift mask blanks include a phase shift mask blank with a resist film and a phase shift mask blank before forming a resist film. The phase shift mask blanks include a phase shift mask blank in which a light-shielding film of a chromium-based material or the like is formed on a halftone film. Phase shift masks include a phase shift mask in which a phase shifter is formed by digging down a substrate.

In this invention, as a substrate, there can be cited a synthetic quartz substrate, a soda-lime glass substrate, an alkali-free glass substrate, a low thermal expansion glass substrate, or the like.

In this invention, it is preferable to use a dry etching gas such as a chlorine-based gas or a mixed gas containing a chlorine-based gas and an oxygen gas in dry etching of a chromium-based thin film serving as a light-shielding film. This is because, by performing dry etching of a chromium-based thin film, made of a material containing chromium and an element such as oxygen or nitrogen, using the above-mentioned dry etching gas, it is possible to increase the dry etching rate and thus to shorten the dry etching time to thereby form a light-shielding film pattern with an excellent sectional shape. As the chlorine-based gas for use as or in the dry etching gas, there can be cited, for example, $Cl_2$, $SiCl_4$, HCl, $CCl_4$, or $CHCl_3$.

In this invention, in dry etching of a silicon-containing film containing silicon, serving as an etching mask film (hard mask film) or a phase shift film (halftone film), or a metal silicide-based thin film, use can be made of, for example, a fluorine-based gas such as $SF_6$, $CF_4$, $C_2F_6$, or $CHF_3$, a mixed gas thereof with He, $H_2$, $N_2$, Ar, $C_2H_4$, or $O_2$, a chlorine-based gas such as $Cl_2$ or $CH_2Cl_2$, or a mixed gas thereof with He, $H_2$, $N_2$, Ar, or $C_2H_4$.

Hereinbelow, Examples of this invention and Comparative Examples thereof will be shown.

Example 1 and Comparative Examples 1 and 2

Referring to FIGS. 2A to 2I, a description will be given of a phase shift mask manufacturing method according to Example 1 of this invention.

First, a substrate made of quartz was mirror-polished and then cleaned, thereby obtaining a light-transmissive substrate (transparent substrate) 1 of 6 inches×6 inches×0.25 inches.

Then, using a mixed target of molybdenum (Mo) and silicon (Si) (Mo:Si=1:9 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based light-semitransmissive phase shift film 5 having a thickness of 70 [nm] on the light-transmissive substrate (transparent substrate) 1 (see FIG. 2A).

Then, using an in-line sputtering apparatus where a plurality of chromium (Cr) targets were disposed in the same chamber, a light-shielding chromium film 2 composed of a CrN film, a CrC film, and a CrON film was formed on the phase shift film 5 (see FIG. 2B). Specifically, first, reactive sputtering was carried out in a mixed gas atmosphere of argon (Ar) and nitrogen ($N_2$) (Ar:$N_2$=72:28 [vol %]; pressure: 0.3 [Pa]), thereby forming the CrN film. Subsequently, reactive sputtering was carried out in a mixed gas atmosphere of argon (Ar) and methane ($CH_4$) (Ar:$CH_4$=96.5:3.5 [vol %]; pressure: 0.3 [Pa]), thereby forming the CrC film on the CrN film. Subsequently, reactive sputtering was carried out in a mixed gas atmosphere of argon (Ar) and nitrogen monoxide (NO) (Ar:NO=87.5:12.5 [vol %]; pressure: 0.3 [Pa]), thereby forming the CrON on the CrC film. In this manner, the light-shielding chromium film 2 having a thickness of 67 [nm] was obtained.

The above CrN film, CrC film, and CrON film were continuously formed using the in-line sputtering apparatus. Thus the light-shielding chromium film 2 containing these CrN, CrC, and CrON was configured such that these components continuously changed in a thickness direction thereof.

Then, in Example 1, using a mixed target of molybdenum (Mo) and silicon (Si) (Mo:Si=9:1 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based inorganic-based etching mask film 3 having a thickness of 5 [nm] on the light-shielding chromium film 2 (see FIG. 2C).

On the other hand, in each of Comparative Examples 1 and 2, using a mixed target of molybdenum (Mo) and silicon (Si) (Mo:Si=20:80 [at %]), reactive sputtering was carried out in a mixed gas atmosphere of argon (Ar) and nitrogen ($N_2$) (Ar:$N_2$=10:90 [vol %]; pressure: 0.3 [Pa]), thereby forming a MoSiN-based inorganic-based etching mask film 3 having a thickness of 5 [nm] (thickness that causes the etching mask film 3 to disappear before the phase shift film 5 disappears in etching of the phase shift film 5: Comparative Example 1) or having a thickness of 92 [nm] (thickness too great to achieve improvement in CD accuracy due to heavy etching mask layer: Comparative Example 2) on the light-shielding chromium film 2 (see FIG. 2C).

Then, a positive electron-beam resist film 4 (FEP171: manufactured by FUJIFILM Electronic Materials Co., Ltd.) was coated to a thickness of 300 [nm] on the inorganic-based etching mask film 3 by a spin-coating method (see FIG. 2D).

In this manner, there was prepared a mask blank 11 of the halftone phase shift type (halftone phase shift mask blank) in which the light-semitransmissive phase shift film 5 of the MoSiN-based material, the light-shielding chromium film 2 of the Cr-based materials, the inorganic-based etching mask film 3 of the MoSiN-based material, and the resist film 4 were formed in this order on the light-transmissive substrate (transparent substrate) 1 (see FIG. 2D).

Then, the resist film 4 was subjected to electron beam writing by the use of JBX9000 manufactured by JEOL Ltd. and then was developed, thereby forming a resist pattern (0.4 μm line-and-space pattern) 41 shown in FIG. 2E (see FIG. 2E).

In this event, the formed resist pattern 41 was a pattern formed according to the hp45 nm and having a portion where the difference in pattern area occurred locally (e.g. an OPC pattern forming portion) and a portion where the difference in pattern density was large in the mask plane.

Then, using the resist pattern 41 as a mask, dry etching mainly with ionicity was carried out at a pressure of 5 [mmTorr] using a mixed gas of $SF_6$ and He to etch the inorganic-based etching mask film 3, thereby forming an inorganic-based etching mask pattern 31 (see FIG. 2F).

Then, the resist pattern 41 was removed. Thereafter, using only the inorganic-based etching mask pattern 31 as a mask, dry etching mainly with radicals where ionicity was increased as much as possible (=ionicity was increased to a level where ions and radicals became approximately equal to each other) was carried out at a pressure of 3 [mmTorr] using a mixed gas of $Cl_2$ and $O_2$ to etch the light-shielding chromium film 2, thereby forming a light-shielding chromium pattern 21 (see FIG. 2G).

Figure 2H:
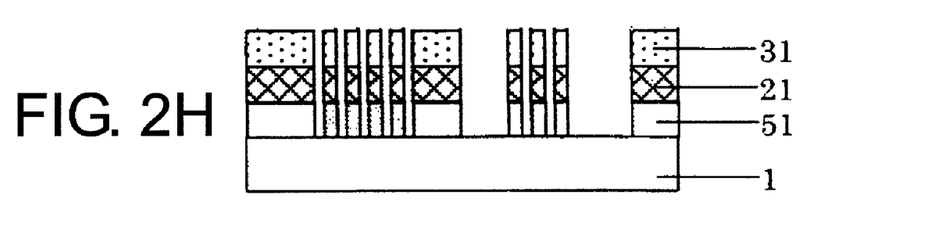
Figure 2I:
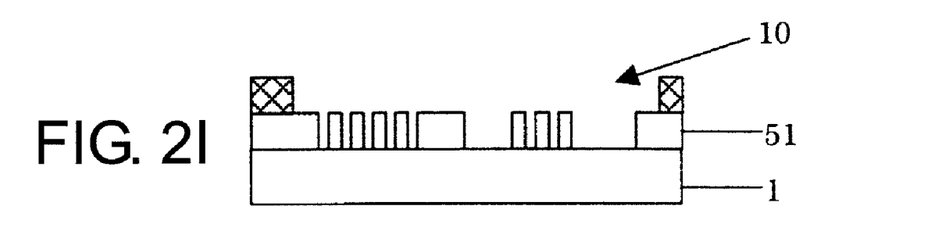

Then, using the inorganic-based etching mask pattern 31 and the light-shielding chromium pattern 21 as a mask, dry etching mainly with ionicity was carried out at a pressure of 5 [mmTorr] using a mixed gas of $SF_6$ and He to etch the phase shift film 5, thereby forming a phase shift film pattern 51 (see FIG. 2H).

Then, using an etching gas such as a $Cl_2$ gas to which the light-transmissive substrate 1 had etching resistance, the inorganic-based etching mask pattern 31 remaining with a very thin thickness was stripped by physical dry etching. Alternatively, the inorganic-based etching mask pattern 31 may be stripped by ionic dry etching using the above-mentioned fluorine-based gas. Then, the resist was coated again and subjected to exposure and development, thereby forming a resist pattern. Using this resist pattern as a mask, the light-shielding chromium pattern 21 at an unnecessary portion was removed by etching. Then, cleaning was carried out, thereby obtaining a phase shift mask 10 (see FIG. 2I). With respect to the inorganic-based etching mask pattern 31 remaining after the formation of the phase shift film pattern 51, inasmuch as the thickness thereof is small, it may be stripped by physical dry etching during the etching for the light-shielding chromium pattern formation.

Then, using CD-SEM (EMU-220) manufactured by Holon Inc., the size of the obtained phase shift film pattern 51 was measured at a portion where the difference in pattern area occurred locally (e.g. an OPC pattern forming portion) and a portion where the difference in pattern density was large in the mask plane, respectively. As a result, it was confirmed that, in the phase shift mask according to Example 1, it was possible to make small the influence of a loading effect at the respective portions and thus to accurately process a fine pattern seen in a hp45 nm phase shift mask. On the other hand, it was confirmed that, in the phase shift mask according to Comparative Example 1, the influence of a loading effect was large at the respective portions and thus it was difficult to accurately process a fine pattern seen in a hp45 nm phase shift mask.

Example 2

Example using SiON Film as Etching Mask Film

Referring again to FIGS. 2A to 2I, a description will be given of a phase shift mask manufacturing method according to Example 2 of this invention. First, as in Example 1, a light-transmissive substrate (transparent substrate) 1 was obtained, then a light-semitransmissive phase shift film 5 was formed (see FIG. 2A), and then a light-shielding chromium film 2 composed of a CrN film, a CrC film, and a CrON film was formed on the phase shift film 5 (see FIG. 2B).

Then, in Example 2, using a silicon (Si) target, reactive sputtering was carried out in a mixed gas atmosphere of argon (Ar) and nitrogen monoxide (NO), thereby forming an inorganic-based etching mask film 3 of SiON (Si:O:N=35:45:20 [at %]) having a thickness of 15 [nm] on the light-shielding chromium film 2 (see FIG. 2C).

Then, a positive electron-beam resist film 4 (FEP171: manufactured by FUJIFILM Electronic Materials Co., Ltd.) was coated to a thickness of 300 [nm] on the inorganic-based etching mask film 3 by a spin-coating method (see FIG. 2D).

In this manner, there was prepared a mask blank 11 of the halftone phase shift type (halftone phase shift mask blank) in which the light-semitransmissive phase shift film 5 of the MoSiN-based material, the light-shielding chromium film 2 of the Cr-based materials, the inorganic-based etching mask film 3 of the SiON material, and the resist film 4 were formed in this order on the light-transmissive substrate (transparent substrate) 1 (see FIG. 2D).

Then, the resist film 4 was subjected to electron beam writing by the use of JBX9000 manufactured by JEOL Ltd.

and then was developed, thereby forming a resist pattern (0.4 μm line-and-space pattern) 41 shown in FIG. 2E (see FIG. 2E).

In this event, the formed resist pattern 41 was a pattern formed according to the hp45 nm and having a portion where the difference in pattern area occurred locally (e.g. an OPC pattern forming portion) and a portion where the difference in pattern density was large in the mask plane.

Then, using the resist pattern 41 as a mask, dry etching mainly with ionicity was carried out at a pressure of 5 [mmTorr] using a mixed gas of $SF_6$ and He to etch the inorganic-based etching mask film 3, thereby forming an inorganic-based etching mask pattern 31 (see FIG. 2F).

Then, the resist pattern 41 was removed. Thereafter, using only the inorganic-based etching mask pattern 31 as a mask, dry etching mainly with radicals where ionicity was increased as much as possible (=ionicity was increased to a level where ions and radicals became approximately equal to each other) was carried out at a pressure of 3 [mmTorr] using a mixed gas of $Cl_2$ and $O_2$ to etch the light-shielding chromium film 2, thereby forming a light-shielding chromium pattern 21 (see FIG. 2G).

Then, using the inorganic-based etching mask pattern 31 and the light-shielding chromium pattern 21 as a mask, dry etching mainly with ionicity was carried out at a pressure of 5 [mmTorr] using a mixed gas of $SF_6$ and He to etch the phase shift film 5, thereby forming a phase shift film pattern 51 (see FIG. 2H).

Then, using an etching gas such as a $Cl_2$ gas to which the light-transmissive substrate 1 had etching resistance, the inorganic-based etching mask pattern 31 remaining with a very thin thickness was stripped by physical dry etching. Alternatively, the inorganic-based etching mask pattern 31 may be stripped by ionic dry etching using the above-mentioned fluorine-based gas. Then, the resist was coated again and subjected to exposure and development, thereby forming a resist pattern. Using this resist pattern as a mask, the light-shielding chromium pattern 21 at an unnecessary portion was removed by etching. Then, cleaning was carried out, thereby obtaining a phase shift mask 10 (see FIG. 2I).

Then, using CD-SEM (EMU-220) manufactured by Holon Inc., the size of the obtained phase shift film pattern 51 was measured at a portion where the difference in pattern area occurred locally (e.g. an OPC pattern forming portion) and a portion where the difference in pattern density was large in the mask plane, respectively. As a result, it was confirmed that, in the phase shift mask according to Example 2, it was possible to make small the influence of a loading effect at the respective portions and thus to accurately process a fine pattern seen in a hp45 nm phase shift mask.

While this invention has been described based on the embodiment, the technical scope of this invention is not limited thereto. It is obvious to a person skilled in the art that various changes or improvements can be added to the above embodiment. It is clear from the description of the claims that the modes added with those changes or improvements can also be included in the technical scope of this invention.

What is claimed is:

1. A phase shift mask blank comprising a substrate transparent to exposure light, a phase shift film containing silicon, a light-shielding film made of a material containing a metal and being resistant to etching of said phase shift film, and an etching mask film made of an inorganic material resistant to etching of said light-shielding film, said phase shift film, said light-shielding film, and said etching mask film being formed in this order on said substrate, wherein $$(t_1/v_1) \leq (t_2/v_2)$$

where $t_1$ is a thickness of said phase shift film, $v_1$ is an etching rate of said phase shift film by dry etching with an etchant using said etching mask film and said light-shielding film as a mask, $t_2$ is a thickness of said etching mask film, and $v_2$ is an etching rate of said etching mask film by dry etching with said etchant.

2. The phase shift mask blank according to claim 1, wherein the etching rate $v_2$ of said etching mask film to the etching rate $v_1$ of said phase shift film is $0.07v_1$ to $0.5v_1$.

3. The phase shift mask blank according to claim 1, wherein said light-shielding film is made of a material containing chromium and said etching mask film is a silicon-containing film containing silicon.

4. A phase shift mask manufacturing method comprising the steps of:
   forming a resist pattern on said etching mask film of said phase shift mask blank according to any one of claim 1 to 3 and dry-etching said etching mask film with a first etchant using said resist pattern as a mask, thereby forming an etching mask film pattern;
   dry-etching said light-shielding film with a second etchant using said etching mask film pattern or said resist pattern and said etching mask film pattern as a mask, thereby forming a light-shielding film pattern; and
   dry-etching said phase shift film with a third etchant using said etching mask film pattern and said light-shielding film pattern as a mask, thereby forming a phase shift film pattern.

5. The phase shift mask manufacturing method according to claim 4, wherein said etching mask film remains after forming said phase shift film pattern and said phase shift mask manufacturing method further comprises a step of removing said etching mask film.

6. The phase shift mask manufacturing method according to claim 4, wherein said first etchant and said third etchant are each an etchant containing a fluorine-based gas and said second etchant is an etchant containing a chlorine-based gas.

7. The phase shift mask blank according to claim 1, wherein the etching mask film has a thickness of 5 nm to 40 nm.

8. The phase shift mask blank according to claim 1, wherein the phase shift mask has a thickness of 100 nm or less.

9. A phase shift mask blank comprising:
   a substrate transparent to exposure light;
   a phase shift film being made of a material containing silicon or containing silicon and at least one of oxygen, nitrogen, and carbon, or being made of a material containing metal silicide or containing metal silicide and a least one of oxygen, nitrogen, an carbon;
   a light-shielding film being made of a material containing chromium; and
   an etching mask film being made of a material containing silicon or containing silicon and at least one of oxygen, nitrogen, and carbon, or being made of a material containing metal silicide or containing metal silicide and at least one of oxygen, nitrogen, and carbon;
   wherein
   said phase shift film, said light-shielding film, and said etching mask film are formed in this order on said substrate,
   wherein $$(t_1/v_1) \leq (t_2/v_2)$$

where $t_1$ is a thickness of said phase shift film, $v_1$ is an etching rate of said phase shift film by dry etching with an etchant using said etching mask film and said light-shielding film as a mask, $t_2$ is a thickness of said etching mask film, and $v_2$ is an etching rate of said etching mask film by dry etching with said etchant.

10. The phase shift mask blank according to claim 9, wherein the etching rate $v_2$ of said etching mask film to the etching rate $v_1$ of said phase shift film is $0.07v_1$ to $0.5v_1$.

11. The phase shift mask blank according to claim 9, wherein the etching mask film is made of a material selected from the group consisting of MoSiN, MoSiON and SiON, and the phase shift film is made of a material selected from the group consisting of MoSiN and MoSiON.

12. The phase shift mask blank according to claim 9, wherein the etching mask film has a thickness of 5 nm to 40 nm.

13. The phase shift mask blank according to claim 9, wherein the phase shift mask has a thickness of 100 nm or less.

14. A phase shift mask manufacturing method comprising the steps of:

forming a resist pattern on said etching mask film of said phase shift mask blank according claim 9 and dry-etching said etching mask film with a first etchant using said resist pattern as a mask, thereby forming an etching mask film pattern;

dry-etching said light-shielding film with a second etchant using said etching mask film pattern or said resist pattern and said etching mask film pattern as a mask, thereby forming a light-shielding film pattern; and dry-etching said phase shift film with a third etchant using said etching mask film pattern and said light-shielding film pattern as a mask, thereby forming a phase shift film pattern.

15. The phase shift mask manufacturing method according to claim 14, wherein said etching mask film remains after forming said phase shift film pattern and said phase shift mask manufacturing method further comprises a step of removing said etching mask film.

16. The phase shift mask manufacturing method according to claim 14, wherein said first etchant and said third etchant are each an etchant containing a fluorine-based gas and said second etchant is an etchant containing a chlorine-based gas.

* * * * *